(12) United States Patent
Fang et al.

(10) Patent No.: US 11,094,829 B2
(45) Date of Patent: Aug. 17, 2021

(54) TFT ARRAY SUBSTRATE AND DISPLAY PANEL

(71) Applicant: Shenzhen China Star Optoelectronics Semiconductor Display Technology Co., Ltd., Shenzhen (CN)

(72) Inventors: Chunhsiung Fang, Shenzhen (CN); Yuanchun Wu, Shenzhen (CN); Poyen Lu, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 416 days.

(21) Appl. No.: 16/099,178

(22) PCT Filed: Sep. 26, 2018

(86) PCT No.: PCT/CN2018/107776
§ 371 (c)(1),
(2) Date: Nov. 5, 2018

(87) PCT Pub. No.: WO2020/015177
PCT Pub. Date: Jan. 23, 2020

(65) Prior Publication Data
US 2021/0126133 A1 Apr. 29, 2021

(30) Foreign Application Priority Data
Jul. 20, 2018 (CN) .......................... 201810805877.6

(51) Int. Cl.
*H01L 27/00* (2006.01)
*H01L 29/00* (2006.01)
(Continued)

(52) U.S. Cl.
CPC .... *H01L 29/78606* (2013.01); *H01L 27/1225* (2013.01); *H01L 29/7869* (2013.01); *H01L 27/3262* (2013.01)

(58) Field of Classification Search
CPC ............ H01L 27/1225; H01L 27/3262; H01L 27/0922; H01L 27/11521; H01L 27/1157;
(Continued)

(56) References Cited

U.S. PATENT DOCUMENTS 7,211,825 B2 * 5/2007 Shih ................. H01L 29/78633
257/13
9,685,542 B2 * 6/2017 Nomura ............. H01L 21/0262
(Continued)

FOREIGN PATENT DOCUMENTS

CN         103988288 A    8/2014
CN         104576689 A    4/2015
(Continued)

*Primary Examiner* — Nikolay K Yushin
(74) *Attorney, Agent, or Firm* — Leong C. Lei

(57) ABSTRACT

The invention provides a TFT array substrate and display panel. The TFT array substrate comprises: a patterned metal oxide active layer, a patterned gate metal layer, and a patterned source/drain metal layer; and further comprises at least a patterned hydrogen-absorbing metal layer, a dielectric layer is disposed between the hydrogen-absorbing metal layer and the patterned metal oxide active layer. The TFT array substrate and display panel of the invention can reduce reaction between the hydrogen atoms and the active layer of metal oxide TFT to achieve improving reliability of TFT.

9 Claims, 4 Drawing Sheets

(51) Int. Cl.
*H01L 29/786* (2006.01)
*H01L 27/12* (2006.01)
*H01L 27/32* (2006.01)

(58) Field of Classification Search
CPC .......... H01L 29/78606; H01L 29/7869; H01L 29/66795; H01L 29/66545; H01L 29/0847; H01L 29/517
See application file for complete search history.

(56) References Cited

U.S. PATENT DOCUMENTS

2005/0275038 A1* 12/2005 Shih .................. H01L 29/78633
257/382
2016/0190290 A1* 6/2016 Nomura ............ H01L 29/66969
257/43
2018/0182783 A1 6/2018 Qin

FOREIGN PATENT DOCUMENTS

CN 104659060 A 5/2015
KR 20130037036 A 4/2013

\* cited by examiner

TFT ARRAY SUBSTRATE AND DISPLAY PANEL

BACKGROUND OF THE INVENTION

1. Field of the Invention

The present invention relates to the field of display and, in particular, to the field of TFT array substrate and display panel.

2. The Related Arts

Metal oxide thin film transistors (TFT) (such as, IGZO; IGTO . . . ), because of simple manufacturing process, high carrier mobility, low leakage current, and better electrical stability, are applied to the driving circuit of an organic light-emitting diode (OLED) display. The metal oxide TFT has the disadvantage that the oxygen atoms in the metal oxide are easily reduced by hydrogen atoms, generating oxygen vacancies, causing the electrical characteristics of the TFT to drift. The known method is to reduce the source of hydrogen atoms. The dielectric layer material of the metal oxide TFT uses SiOx instead of SiNx (such as, buffer layer, interlayer insulating layer (ILD), passivation layer (PV), and other layers). However, according to different chemical vapor deposition (CVD) film formation conditions, SiOx film still contains one to ten atomic percent (at %) of hydrogen content, these hydrogen atoms in the subsequent high temperature process, or the local high temperature generated by the current operation of the display, have the opportunity to diffuse from the SiOx film into the channel of the metal oxide TFT, and the electrical characteristics of the TFT are shifted to cause an abnormal display on the screen.

Referring to FIG. 1, FIG. 1 is a cross-sectional view of a known OLED display panel, which mainly comprise a TFT array substrate having a metal oxide TFT, and an OLED device disposed on the TFT array substrate. The TFT array substrate mainly comprise: a substrate 1, a buffer layer 2 disposed on the substrate 1, an active layer 3 disposed on the buffer layer 2, and a gate insulating layer 4 disposed on the buffer layer 2 and the active layer 3, a gate metal layer 5 disposed on the gate insulating layer 4, an interlayer insulating layer 6 disposed on the buffer layer 2, the active layer 3, and the gate metal layer 5, a source/drain metal layer 7 disposed on the interlayer insulating layer 6, a passivation layer 8 disposed on the source/drain metal layer 7, and a planarization layer 9 disposed on the passivation layer 8. A switching TFT, a driving TFT, and a storage capacitor are formed by the patterned active layer 3, gate metal layer 5, and source/drain metal layer 7 and are used to form a TFT driving circuit for driving a pixel. The TFT devices forming the TFT driving circuit can be a metal oxide TFT, and the corresponding active layer 3 is a metal oxide active layer. The buffer layer 2, the interlayer insulating layer 6 and the passivation layer 8 are prepared by using SiOx. As shown by the dotted arrows in FIG. 1, the hydrogen atoms contained in the buffer layer 2, the interlayer insulating layer 6 and the passivation layer 8 are diffused to the channel formed by the active layer 3, and the electrical characteristics of the TFT are shifted.

The OLED device is fabricated on the planarization layer 9 of the TFT array substrate, and the planarization layer 9 is disposed with vias for connection to the TFT devices in the TFT array substrate. The OLED device mainly comprises an anode 10 disposed on the planarization layer 9, a pixel definition layer 20 disposed on the planarization layer 9 and the anode 10, and an organic functional layer 21 disposed on the anode 10 and the pixel definition layer 20, and a cathode 22 on the organic functional layer 21; when a suitable voltage is applied to the anode 10 and the cathode 22, the organic functional layer 21 emits light.

SUMMARY OF THE INVENTION

The primary object of the present invention is to provide a TFT array substrate and display panel, able to reduce the reaction between the hydrogen atoms and the active layer of the metal oxide TFT.

To achieve the above objects, the present invention provides a TFT array substrate, comprising: a patterned metal oxide active layer, a patterned gate metal layer, and a patterned source/drain metal layer, further comprising at least a patterned hydrogen-absorbing metal layer, a dielectric layer being disposed between the hydrogen-absorbing metal layer and the patterned metal oxide active layer.

Wherein, the hydrogen-absorbing metal is titanium metal or nickel alloy metal.

Wherein, the TFT array substrate comprises a patterned first hydrogen-absorbing metal layer, and the first hydrogen-absorbing metal layer is disposed opposite to the patterned active layer in upper and lower manner.

Wherein, the TFT array substrate further comprises a buffer layer as a dielectric layer disposed between the first hydrogen-absorbing metal layer and the patterned active layer.

Wherein, the patterned first hydrogen-absorbing metal layer has an area equal to or slightly larger than the patterned active layer.

Wherein, the TFT array substrate further comprises a patterned second hydrogen-absorbing metal layer, and the second hydrogen-absorbing metal layer is disposed at the bottom of the patterned gate metal layer.

Wherein, the TFT array substrate further comprises a gate insulating layer disposed as a dielectric layer between the second hydrogen-absorbing metal layer and the patterned active layer.

Wherein, the patterned second hydrogen-absorbing metal layer has an area equal to or slightly larger than the patterned gate metal layer.

Wherein, the TFT array substrate further comprises a patterned third hydrogen-absorbing metal layer, and the third hydrogen-absorbing metal layer is disposed at the bottom of the patterned source/drain metal layer.

Wherein, the TFT array substrate further comprises an interlayer insulating layer disposed as a dielectric layer between the third hydrogen-absorbing metal layer and the patterned active layer.

Wherein, the patterned third hydrogen-absorbing metal layer has an area equal to or slightly larger than the patterned source/drain metal layer.

The present invention also provides a display panel comprising the TFT array substrate according to any of the above.

In summary, the TFT array substrate and the display panel of the present invention can reduce the reaction between hydrogen atoms and the active layer of the metal oxide TFT, and achieve the object of improving the reliability of the TFT.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects and not intended to describe a particular order.

Similar to a general TFT array substrate, the TFT array substrate of the present invention mainly comprises a patterned metal oxide active layer, a patterned gate metal layer, and a patterned source/drain metal layer; and the metal oxide active layer, the gate metal layer, and the source/drain metal layer can form a metal oxide TFT device. The invention further comprises at least a patterned hydrogen-absorbing metal layer, and the hydrogen-absorbing metal layer reduces the reaction between the hydrogen atom and the active layer of the metal oxide TFT, thereby improving the TFT reliability. A dielectric layer is disposed between the hydrogen-absorbing metal layer and the patterned metal oxide active layer to separate the metal oxide active layer and the hydrogen-absorbing metal layer. The hydrogen-absorbing metal may be a titanium metal or a nickel alloy metal, or other suitable material.

Figure 1:
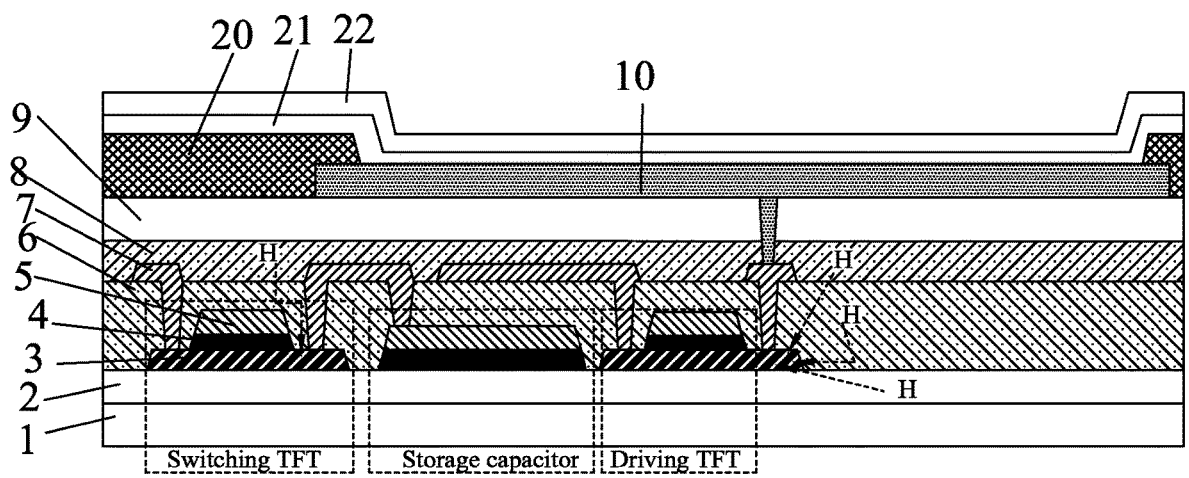
FIG. 1 is a schematic cross-sectional view showing the structure of a known OLED display panel.
Figure 2:
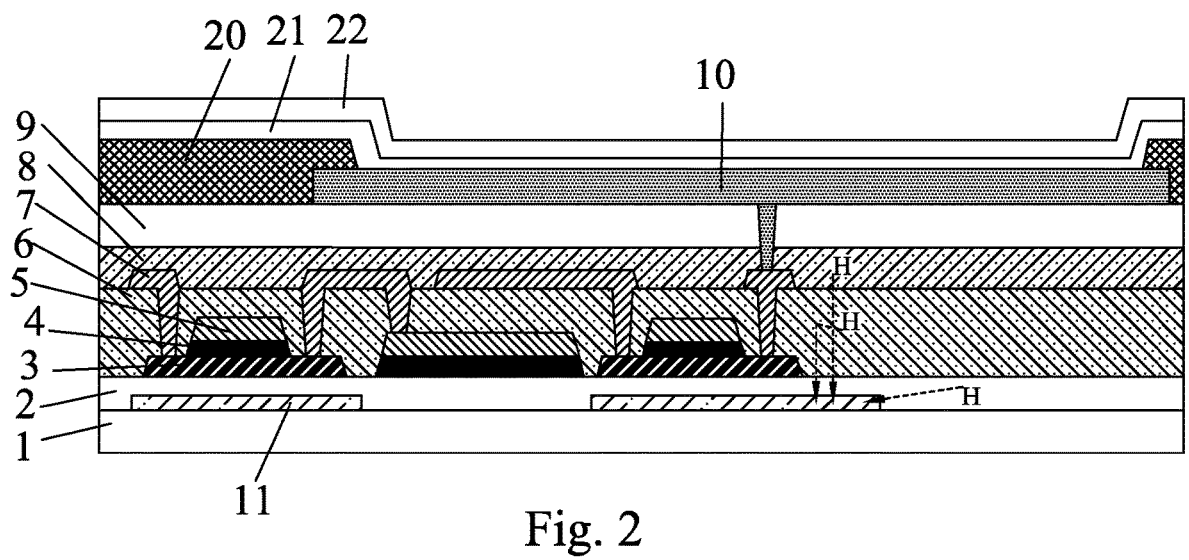
FIG. 2 is a schematic cross-sectional view showing the structure of the display panel comprising the first embodiment of the TFT array substrate of the present invention.

FIG. 2 is a schematic cross-sectional view of a display panel comprising the TFT array substrate of the present invention. The display panel mainly comprise the first embodiment of the TFT array substrate of the present invention and an OLED device. In the preferred embodiment, the TFT array substrate mainly comprises: a substrate 1, a buffer layer 2 disposed on the substrate 1, a metal oxide active layer 3 disposed on the buffer layer 2, a gate insulating layer 4 disposed on the buffer layer 2 and the active layer 3, a gate metal layer 5 disposed on the gate insulating layer 4, an interlayer insulating layer 6 disposed on the buffer layer 2, the active layer 3, and the gate metal layer 5, a source/drain metal layer 7 disposed on the interlayer insulating layer 6, a passivation layer 8 disposed on the source/drain metal layer 7, and a planarization layer 9 disposed on the passivation layer 8; a channel is formed in the middle of the active layer 3, and the active layer 3 is respectively connected to the source and the drain of the TFT at both ends. A switching TFT, a driving TFT, a storage capacitor and other devices can be formed through the structure of the patterned active layer 3, the gate metal layer 5, and the source/drain metal layer 7, which can be used to form a TFT driving circuit for driving the pixel. A metal oxide TFT device can be formed through the metal oxide active layer 3, wherein the buffer layer 2, the interlayer insulating layer 6 and the passivation layer 8 are fabricated using SiOx.

In the preferred embodiment, the OLED device is fabricated on the planarization layer 9 of the TFT array substrate, and the planarization layer 9 is disposed with vias for connection to the TFT devices in the TFT array substrate. The OLED device mainly comprises: a first electrode disposed on the planarization layer 9, an anode 10 in this embodiment, a pixel definition layer 20 disposed on the planarization layer 9 and the anode 10, an upper organic functional layer 21 disposed on the anode 10 and the pixel definition layer 20, a second electrode disposed on the organic functional layer 21, a cathode 22 in this embodiment; when an appropriate voltage is applied to the anode 10 and the cathode 22, the organic functional layer 21 emits light.

The first embodiment of the TFT array substrate of the present invention further comprises a patterned first hydrogen-absorbing metal layer 11, and the first hydrogen-absorbing metal layer 11 is disposed opposite to the patterned active layer 3. The buffer layer 2 between the first hydrogen-absorbing metal layer 11 and the patterned active layer 3 may serve as a dielectric layer. The patterned first hydrogen-absorbing metal layer 11 may have an area equal to or slightly larger than the patterned active layer 3.

Titanium is a hydrogen-absorbing material that can increase the hydrogen atom solid content in titanium by supplementing with appropriate temperature conditions. In this embodiment, a titanium metal layer is formed on the glass substrate 1 of the TFT array substrate as the first hydrogen-absorbing metal layer 11, and a titanium metal area is formed under the active layer 3 with respect to the metal oxide TFT by a yellow etching process. The size of the area is slightly larger than the area of the active layer 3 of the metal oxide TFT. There are many high temperature annealing processes in the subsequent TFT process, as shown by the dotted arrows in FIG. 2. At this point, the hydrogen atoms in the SiOx film layers of the buffer layer 2, the interlayer insulating layer 6 and the passivation layer 8 are released, and are diffused everywhere. When a hydrogen atom diffuses into the titanium metal, the hydrogen atom stays in the titanium metal lattice in an interstitial atom form, or forms titanium hydride with titanium metal (TiHx; x=1.5~1.99). After the hydrogen atom enters the titanium metal, higher activation energy must be used to remove the hydrogen atoms from the titanium metal. Therefore, the hydrogen atoms released from the SiOx film layer can be effectively confined to the titanium metal layer, and the reaction between the hydrogen atoms and the active layer 3 of the metal oxide TFT can be reduced to achieve the purpose of improving TFT reliability.

Figure 3:
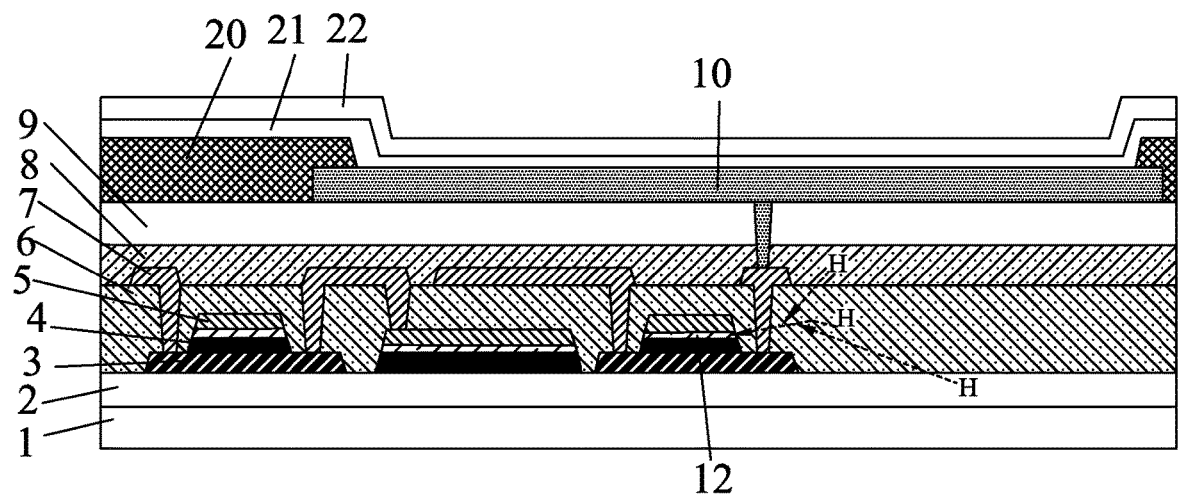
FIG. 3 is a schematic cross-sectional view showing the structure of the display panel comprising the second embodiment of the TFT array substrate of the present invention.

Referring to FIG. 3, FIG. 3 is a schematic cross-sectional view of a display panel comprising the second embodiment of the TFT array substrate of the present invention. The display panel mainly comprise the second embodiment of the TFT array substrate of the present invention and an OLED device. The description of the same portions as in the first embodiment is omitted. The second embodiment of the TFT array substrate of the present invention further comprises a patterned second hydrogen-absorbing metal layer 12, and the second hydrogen-absorbing metal layer 12 is disposed at the bottom of the patterned gate metal layer 5. The dielectric layer between the second hydrogen-absorbing metal 12 and the patterned active layer 3 mainly comprises the gate insulating layer 4 disposed therebetween. The patterned second hydrogen-absorbing metal layer 12 may have an area equal to or slightly larger than the patterned gate metal layer 5.

In this embodiment, a titanium metal layer is formed on the bottom of the gate metal layer 5 as the second hydrogen-absorbing metal layer 12, and the gate metal may be Cu, Al, and other low-resistance metals or alloy materials, and the gate metal pattern (including titanium metal) may be formed by the same yellow light etching process. The titanium metal can also be regarded as one of the materials of the gate metal. There are many high temperature annealing processes in the subsequent TFT process, as shown by the dotted arrows in FIG. 3. At this point, the hydrogen atoms in the SiOx film layers of the buffer layer 2, the interlayer insulating layer 6 and the passivation layer 8 are released, and are diffused everywhere. When a hydrogen atom diffuses into the titanium metal, the hydrogen atom stays in the titanium metal lattice in an interstitial atom form, or forms titanium hydride with titanium metal (TiHx; x=1.5~1.99). After the hydrogen atom enters the titanium metal, higher activation energy must be used to remove the hydrogen atoms from the titanium metal. Therefore, the hydrogen atoms released from the SiOx film layer can be effectively confined to the titanium metal layer, and the reaction between the hydrogen atoms and the active layer 3 of the metal oxide TFT can be reduced to achieve the purpose of improving TFT reliability.

Figure 4:
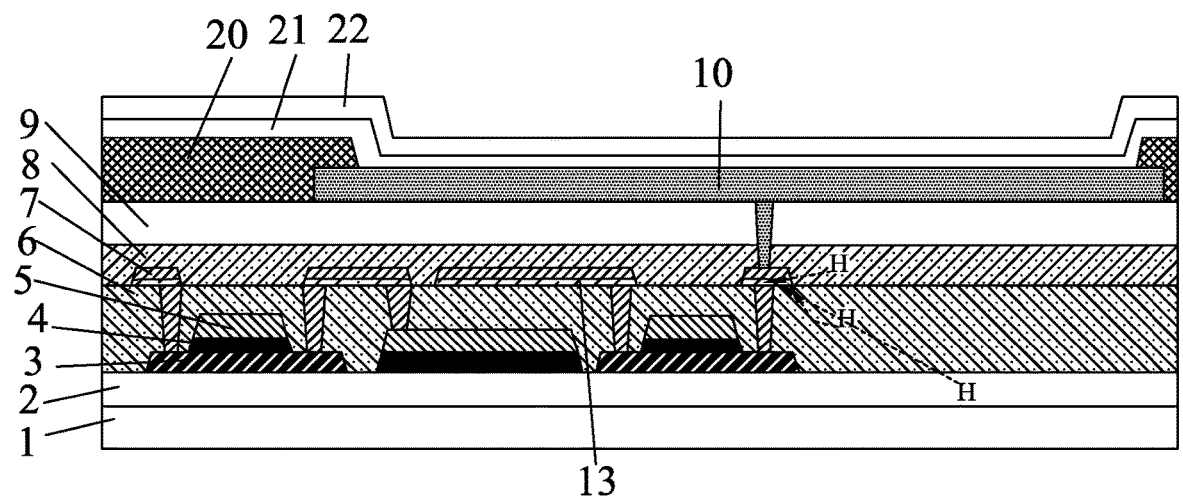
FIG. 4 is a schematic cross-sectional view showing the structure of the display panel comprising the third embodiment of the TFT array substrate of the present invention.

Referring to FIG. 4, FIG. 4 is a schematic cross-sectional view of a display panel comprising the third embodiment of the TFT array substrate of the present invention. The display panel mainly comprise the third embodiment of the TFT array substrate of the present invention and an OLED device. The description of the same portions as in the first embodiment is omitted. The third embodiment of the TFT array substrate of the present invention further comprises a patterned third hydrogen-absorbing metal layer 13 disposed on the bottom of the patterned source/drain metal layer 7. The interlayer insulating layer 6 disposed between the third hydrogen-absorbing metal layer 13 and the patterned active layer 3 serves as a dielectric layer therebetween. The patterned third hydrogen-absorbing metal layer 13 may have an area equal to or slightly larger than the patterned source/drain metal layer 7.

In this embodiment, a titanium metal layer is formed on the bottom of the source/drain metal layer 7 as the third hydrogen-absorbing metal layer 13, and the source/drain metal may be Cu, Al, and other low-resistance metals or alloy materials, and the source/drain metal pattern (including titanium metal) may be formed by the same yellow light etching process. The titanium metal can also be regarded as one of the materials of the source/drain metal. There are many high temperature annealing processes in the subsequent TFT process, as shown by the dotted arrows in FIG. 4. At this point, the hydrogen atoms in the SiOx film layers of the buffer layer 2, the interlayer insulating layer 6 and the passivation layer 8 are released, and are diffused everywhere. When a hydrogen atom diffuses into the titanium metal, the hydrogen atom stays in the titanium metal lattice in an interstitial atom form, or forms titanium hydride with titanium metal (TiHx; x=1.5~1.99). After the hydrogen atom enters the titanium metal, higher activation energy must be used to remove the hydrogen atoms from the titanium metal. Therefore, the hydrogen atoms released from the SiOx film layer can be effectively confined to the titanium metal layer, and the reaction between the hydrogen atoms and the active layer 3 of the metal oxide TFT can be reduced to achieve the purpose of improving TFT reliability.

Figure 5:
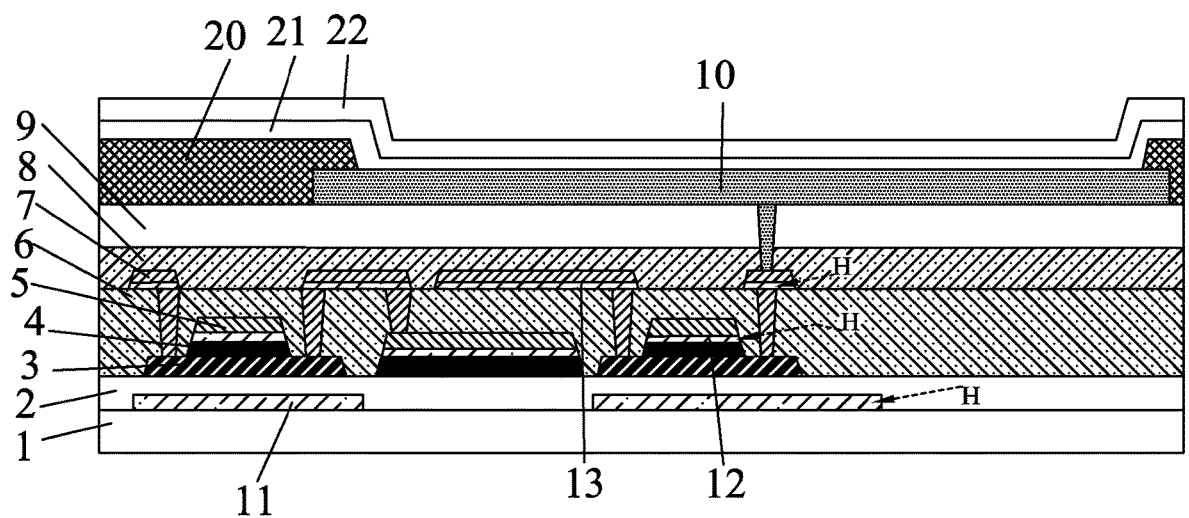
FIG. 5 is a schematic cross-sectional view showing the structure of the display panel comprising the fourth embodiment of the TFT array substrate of the present invention.

The first, second and third embodiments of the TFT array substrate of the present invention can be used in combination. FIG. 5 is a schematic cross-sectional view of a display panel comprising the fourth embodiment of the TFT array substrate of the present invention. The display panel mainly comprises the fourth embodiment of the TFT array substrate of the present invention and an OLED device. Referring to the description of the same portions in the foregoing first, second and third embodiments, the fourth embodiment of the TFT array substrate of the present invention, on the glass substrate 1, combines the previous embodiments to form a layer of titanium metal respectively at the bottom of the gate metal layer 5 and at the bottom of the source/drain metal layer 7, and uses a yellow etching process to form a corresponding metal pattern to form the first hydrogen-absorbing metal layer 11, the second hydrogen-absorbing metal layer 12, and the third hydrogen-absorbing metal layer 13. There are many high temperature annealing processes in the subsequent TFT process, as shown by the dotted arrows in FIG. 5. At this point, the hydrogen atoms in the SiOx film layers of the buffer layer 2, the interlayer insulating layer 6 and the passivation layer 8 are released, and are diffused everywhere. When a hydrogen atom diffuses into the titanium metal, the hydrogen atom stays in the titanium metal lattice in an interstitial atom form, or forms titanium hydride with titanium metal (TiHx; x=1.5~1.99). After the hydrogen atom enters the titanium metal, higher activation energy must be used to remove the hydrogen atoms from the titanium metal. Therefore, the hydrogen atoms released from the SiOx film layer can be effectively confined to the titanium metal layer, and the reaction between the hydrogen atoms and the active layer 3 of the metal oxide TFT can be reduced to achieve the purpose of improving TFT reliability.

Accordingly, the present invention also provides a display panel comprising the above embodiment of the TFT array substrate.

In summary, the TFT array substrate and the display panel of the present invention can reduce the reaction between hydrogen atoms and the active layer of the metal oxide TFT, and achieve the object of improving the reliability of the TFT.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A thin film transistor (TFT) array substrate, comprising: a patterned metal oxide active layer, a patterned gate metal layer, and a patterned source/drain metal layer, further comprising at least a patterned hydrogen-absorbing metal layer, a dielectric layer being disposed between the hydrogen-absorbing metal layer and the patterned metal oxide active layer,
   wherein the dielectric layer of the TFT array substrate comprises a material of SiOx that contains and releases hydrogen atoms, and wherein the hydrogen-absorbing metal comprises a material of titanium of which a part is combined with the hydrogen atoms released from the the material of SiOx of the dielectric layer to form titanium hydride such that the hydrogen-absorbing metal layer comprises both titanium and titanium hydride.

2. A display panel, comprising the TFT array substrate as claimed in claim 1.

3. The TFT array substrate as claimed in claim 1, wherein the TFT array substrate further comprises a patterned second hydrogen-absorbing metal layer, and the second hydrogen-absorbing metal layer is disposed at the bottom of the patterned gate metal layer.

4. The TFT array substrate as claimed in claim 3, wherein the TFT array substrate further comprises a gate insulating layer disposed as a dielectric layer between the second hydrogen-absorbing metal layer and the patterned active layer.

5. The TFT array substrate as claimed in claim 1, wherein the TFT array substrate further comprises a patterned third hydrogen-absorbing metal layer, and the third hydrogen-absorbing metal layer is disposed at the bottom of the patterned source/drain metal layer.

6. The TFT array substrate as claimed in claim 5, wherein the TFT array substrate further comprises an interlayer insulating layer disposed as a dielectric layer between the third hydrogen-absorbing metal layer and the patterned active layer.

7. The TFT array substrate as claimed in claim 1, wherein the TFT array substrate comprises a patterned first hydrogen-absorbing metal layer, and the first hydrogen-absorbing metal layer is disposed opposite to the patterned active layer in upper and lower manner.

8. The TFT array substrate as claimed in claim 7, wherein the TFT array substrate further comprises a buffer layer as a dielectric layer disposed between the first hydrogen-absorbing metal layer and the patterned active layer.

9. The TFT array substrate as claimed in claim 7, wherein the patterned first hydrogen-absorbing metal layer has an area equal to or slightly larger than the patterned active layer.

* * * * *